US010892716B2

(12) United States Patent
Nakano et al.

(10) Patent No.: US 10,892,716 B2
(45) Date of Patent: Jan. 12, 2021

(54) AMPLIFIER

(71) Applicant: Nippon Telegraph and Telephone Corporation, Tokyo (JP)

(72) Inventors: Shinsuke Nakano, Atsugi (JP); Hiroaki Katsurai, Atsugi (JP); Masafumi Nogawa, Atsugi (JP); Shunji Kimura, Atsugi (JP); Masatoshi Tobayashi, Isehara (JP); Shigehiro Kurita, Ebina (JP); Masahiro Endo, Atsugi (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 454 days.

(21) Appl. No.: 15/735,553

(22) PCT Filed: Jul. 1, 2016

(86) PCT No.: PCT/JP2016/003166
§ 371 (c)(1),
(2) Date: Dec. 11, 2017

(87) PCT Pub. No.: WO2017/002374
PCT Pub. Date: Jan. 5, 2017

(65) Prior Publication Data
US 2020/0036344 A1 Jan. 30, 2020

(30) Foreign Application Priority Data
Jul. 1, 2015 (JP) .................................. 2015-133047

(51) Int. Cl.
*H03F 3/08* (2006.01)
*H03F 1/26* (2006.01)
(Continued)

(52) U.S. Cl.
CPC .............. *H03F 1/26* (2013.01); *H03F 1/083* (2013.01); *H03F 3/08* (2013.01); *H03F 3/211* (2013.01);
(Continued)

(58) Field of Classification Search
CPC ...... H03F 3/08; H03F 3/082; H03F 2200/489; H03F 2200/492; H03F 2200/495; H03F 2200/498
(Continued)

(56) References Cited

U.S. PATENT DOCUMENTS

| 3,331,028 A | * | 7/1967 | Bay ..................... | H03G 3/3057 |
| | | | | 330/283 |
| 5,113,151 A | * | 5/1992 | Yamamoto .......... | H03G 3/3084 |
| | | | | 250/214 A |
| 5,945,878 A | * | 8/1999 | Westwick .............. | H03F 3/193 |
| | | | | 327/359 |

FOREIGN PATENT DOCUMENTS

| CN | 102204421 A | 9/2011 |
| CN | 102893519 A | 1/2013 |

(Continued)

OTHER PUBLICATIONS

Chia-Ming Tsai, *A 40 mW 3 Gb/s Self-Compensated Differential Transimpedance Amplifier with Enlarged Input Capacitance Tolerance in 0.18 μm CMOS Technology*, IEEE Journal of Solid-State Circuits, vol. 44, No. 10, Oct. 2009, pp. 2671-2677.
(Continued)

*Primary Examiner* — Steven J Mottola
(74) *Attorney, Agent, or Firm* — Workman Nydegger

(57) ABSTRACT

An amplifier applied to TIA is provided to suppress the noise caused by a current source. An amplifier constituting a transimpedance amplifier includes an inductor element inserted between a current source connected to an input terminal of an amplification stage and a power source
(Continued)

voltage line. The current source includes a first transistor in which a base terminal is connected to a current control bias and a collector terminal is connected to the input terminal. The inductor element is inserted between the emitter terminal of the first transistor and the power source voltage line.

14 Claims, 16 Drawing Sheets

(51) Int. Cl.
    *H03F 1/08*     (2006.01)
    *H03F 3/21*     (2006.01)
    *H03F 3/347*     (2006.01)
    *H04B 10/69*     (2013.01)

(52) U.S. Cl.
    CPC ........... *H03F 3/347* (2013.01); *H04B 10/693* (2013.01); *H03F 2200/294* (2013.01); *H03F 2200/72* (2013.01)

(58) Field of Classification Search
    USPC .................................................. 330/283, 308
    See application file for complete search history.

(56) References Cited

FOREIGN PATENT DOCUMENTS

| | | |
|---|---|---|
| CN | 101040468 A | 9/2017 |
| EP | 2 869 465 A1 | 5/2015 |
| JP | H09-260973 A | 10/1997 |
| JP | 2000-040203 A | 2/2000 |
| JP | 2001-251150 A | 9/2001 |
| JP | 2004-207874 A | 7/2004 |
| JP | 2009-290520 A | 12/2009 |

OTHER PUBLICATIONS

Rania H. Mekky et al., *Ultra Low-Power Low-Noise transimpedance Amplifier for MEMS-Based Reference Oscillators*, IEEE International Conference on Electronics, Circuits, and Systems, 2013, pp. 4.

International Search Report dated Sep. 20, 2016, issued in PCT Application No. PCT/2016/003166, filed Jul. 1, 2016.

International Preliminary Report on Patentability dated Jan. 2, 2018, issued in PCT Application No. PCT/2016/003166, filed Jul. 1, 2016.

Bahram Zand et al., *A Transimpedance Amplifier with DC-Coupled Differential Photodiode Current Sensing for Wireless Optical Communications*, IEEE 2001 Custom Integrated Circuits Conference, San Diego, May 6, 2001, XP010546931, pp. 455-458.

European Search Report dated Oct. 30, 2018, issued in EP Application No. EP16817484.5.

\* cited by examiner

AMPLIFIER

TECHNICAL FIELD

The present invention relates to an amplifier. More particularly, the invention relates to an amplifier applied to a transimpedance amplifier to covert a current signal converted from an optical signal by a photodetector in an optical receiver to a voltage signal.

BACKGROUND ART

A transimpedance amplifier (TIA) is used for an optical receiver and amplifies the signal strength while converting a current signal converted from an optical signal by a photodetector to a voltage signal. The optical receiver is desired to be able to receive a minute optical signal. Thus, the TIA is desired to have a low noise characteristic.

FIG. 1 illustrates the configuration of a conventional grounded emitter-type TIA. The grounded emitter-type TIA includes: a transistor Q3 inserted between an input terminal IN and a negative-side power source voltage VEE; an amplification stage consisting of a transistor Q1 and resistances R1 and R2; an output stage consisting of a transistor Q2 and resistance R3; and a feedback resister R4 inserted between an output terminal OUT and the input terminal IN. The transistor Q3 functions as a variable current source to control the current amount thereof to thereby control the DC operating point of the amplifier. The control of the DC operating point by the variable current source is used for an offset compensation function for example (see Non-patent Publication 1 for example).

FIG. 2 illustrates the configuration of a conventional grounded base-type TIA. The grounded base-type TIA includes the transistor Q2 inserted between the input terminal IN and the negative-side power source voltage VEE and an amplification stage consisting of the transistor Q1 and the resistance R1. The transistor Q2 functions as a variable current source to control the DC current flowing in the transistor Q1 and the DC component of the input signal current (see Non-patent Publication 2 for example).

FIG. 3 illustrates the configuration of a conventional RGC (Regulated Cascode)-type TIA. As in the grounded base-type TIA, the transistor Q2 functions as a variable current source to control the DC current flowing in the transistor Q1 of the amplification stage and the DC component of the input signal current. As described above, the amplifier applied to the TIA includes the current source formed by a transistor.

However, in the case where the amplifier includes therein a current source, the current source causes high noise, which disadvantageously causes a deteriorated noise characteristic of the TIA. In the case of the above-described TIA in which the current source is connected to the input terminal in particular, noise has an influence on a stage prior to the amplification of the input signal, thus causing a very-remarkable deterioration of the noise characteristic.

CITATION LIST

Non Patent Literature

NPL 1: Chia-Ming Tsai, "A 40 mW 3 Gb/s Self-Compensated Differential Transimpedance Amplifier With Enlarged Input Capacitance Tolerance in 0.18 μm CMOS Technology," IEEE Journal of Solid-State Circuits, Vol. 44, No. 10, pp. 2671-2677, October 2009.

NPL 2: Rania H. Mekky et al., "Ultra Low-Power Low-Noise Transimpedance Amplifier for MEMS-Based Reference Oscillators," IEEE International Conference on Electronics, Circuits, and Systems 2013.

SUMMARY OF INVENTION

It is an objective of the present invention to provide an amplifier applied to the TIA. This amplifier suppresses the noise caused by the current source.

In order to achieve the objective as described above, the present invention provides an amplifier constituting a transimpedance amplifier includes an inductor element inserted between a current source connected to an input terminal of an amplification stage and a power source voltage line.

The current source includes a first transistor in which a base terminal is connected to a current control bias and a collector terminal is connected to the input terminal. The inductor element is inserted between the emitter terminal of the first transistor and the power source voltage line.

DESCRIPTION OF EMBODIMENTS

The following section will describe in detail an embodiment of the present invention with reference to the drawings. The TIA in the embodiment includes an inductor element connected to an emitter terminal of a transistor functioning as a current source.

When assuming that the current source is a parallel connection of an ideal current source and an internal resistance R, then the current noise per a unit frequency caused by the current source can be represented by:

$$\overline{I_n^2} = 4kT/R [A^2/Hz] \qquad \text{Formula 1}$$

Figure 4:
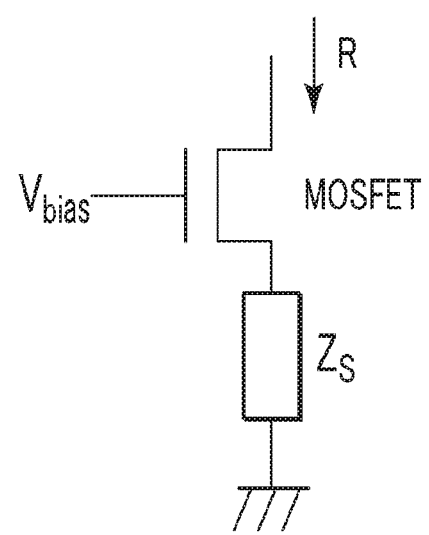
FIG. 4 is a diagram to explain the MOSFET internal resistance.

Thus, an increase of the internal resistance R reduces the current noise. In the case of the ideal current source, the internal impedance is infinite and the current noise is zero. However, an actually-configured current source has a limited internal impedance. Thus, noise caused by the current source deteriorates the noise characteristic of the TIA. For example, a current source is configured as shown in FIG. 4 so that the MOSFET source terminal is connected to an element having an impedance $Z_S$. The internal resistance R of this current source is calculated by the following formula.

$$R = r_o + (1 + g_m r_o) Z_S \qquad \text{Formula 2}$$

In the formula, $r_o$ represents the drain resistance of the transistor itself and $g_m$ represents a transconductance. As is clear from this formula, a transistor in which a source terminal is connected to a high impedance can be used as a current source to thereby increase the internal impedance of the current source.

On the other hand, when a resistance element having a high resistance value is used in order to increase the internal impedance of the current source, the resistance causes a large voltage drop. In the case of such a configuration, the driving of the current source requires a high bias for a gate terminal and a drain terminal, thus disadvantageously causing limited applications. This also applies to a bipolar transistor.

In view of the above, according to this embodiment, the transistor functioning as a current source has the emitter terminal connected to the inductor element to thereby achieve a current source having a high internal impedance in a high frequency band while maintaining a high bias for driving the current source. This can consequently minimize the total amount of the current noise generated from the current source. Is this embodiment, an increase of the inductance of the inductor element can provide an increase of the internal impedance of the current source, thus realizing a higher noise reduction effect. Resistance also may be inserted in a serial manner to the inductor element.

Inductance Element

Regarding the inductor element used in this embodiment, an increase of the inductance value can provide a higher effect as described above. For example, in the case of a wide band TIA having a signal band exceeding 10 GHz, the noise reduction effect must be obtained on the order of at least some GHz frequency range. In order to realize this, the current source of the TIA requires an inductor element having an inductance value on the order of nH or more.

The wide band TIA is generally manufactured on a semiconductor integrated circuit. The integrated circuit has generally thereon an inductor element having a planer-type structure that uses only a wiring formed in the wiring layer of the top layer. However, in order to miniaturize and mount an inductor element having an inductance value on the order of nH or more, an inductor element is desirably used a three-dimensional structure having a wiring layer of a lower layer.

Figure 5:
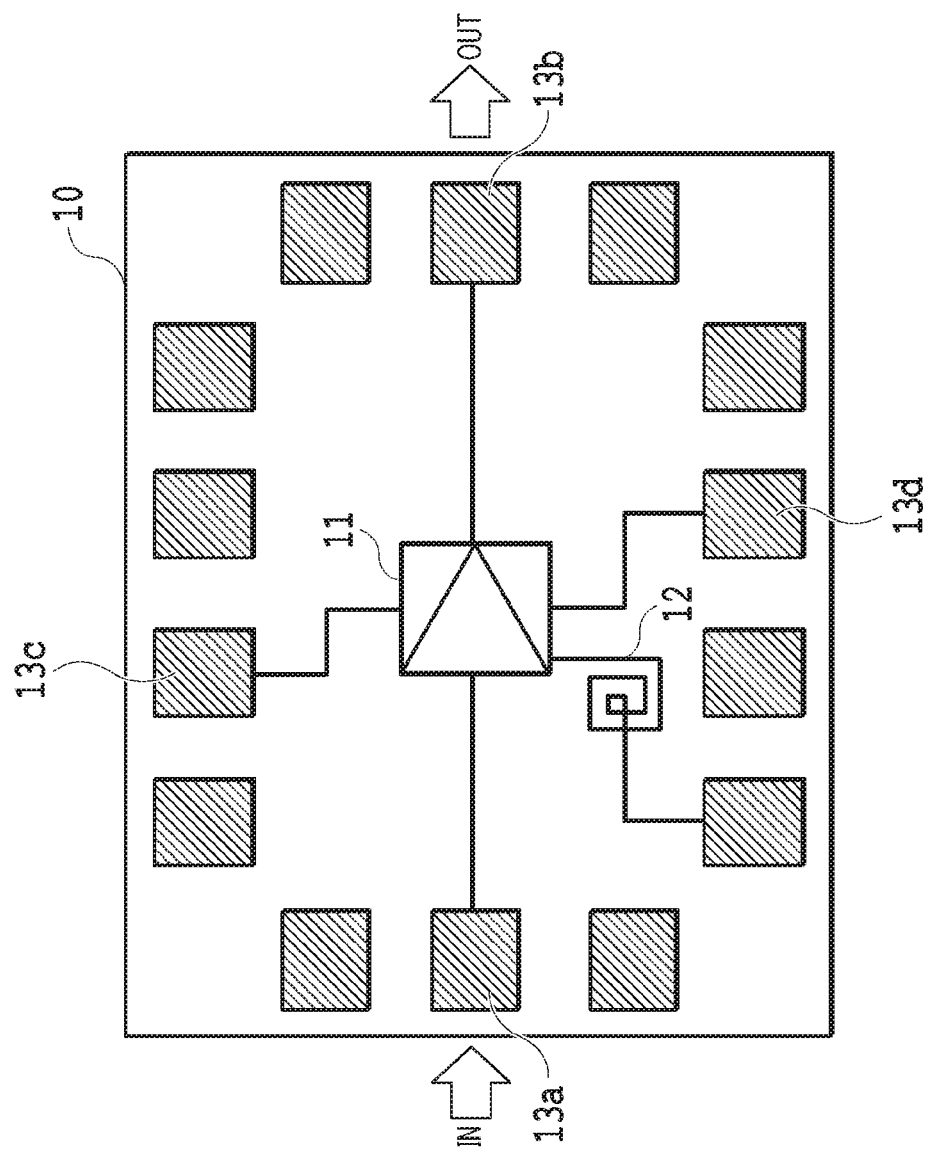
FIG. 5 illustrates a TIA chip structure.

FIG. 5 illustrates the chip structure of the TIA. The TIA chip 10 has thereon a TIA 11. The TIA 11 is connected to an electrode pad 13a for the input terminal IN and an electrode pad 13b for the output terminal OUT. This structure includes an electrode pad 13c for the positive-side power source voltage VCC and an electrode pad 13d for the negative-side power source voltage VEE and the electrode pad 13d for an inductor element 12 for example that are connected to the TIA 11.

In the case of a high-frequency analog integrated circuit whose typical example is TIA, the chip size is restricted by the electrode pad size and the number of required electrode pads. When an inductor element is mounted on an integrated circuit, the increase of the integrated circuit size must be avoided by reducing the inductor element size to a size similar to that of the electrode pad. Thus, an inductor element having a three-dimensional structure can be used to provide an inductance value of an nH-order value or more, thereby providing a further higher noise reduction effect.

The following section will describe the illustrative examples of a grounded base-type TIA, a grounded emitter-type TIA, and an RGC-type TIA, respectively. However, the invention can be applied to any TIA having thereon a current source and is not limited to such TIA configurations.

Grounded Base-Type TIA

Figure 6:
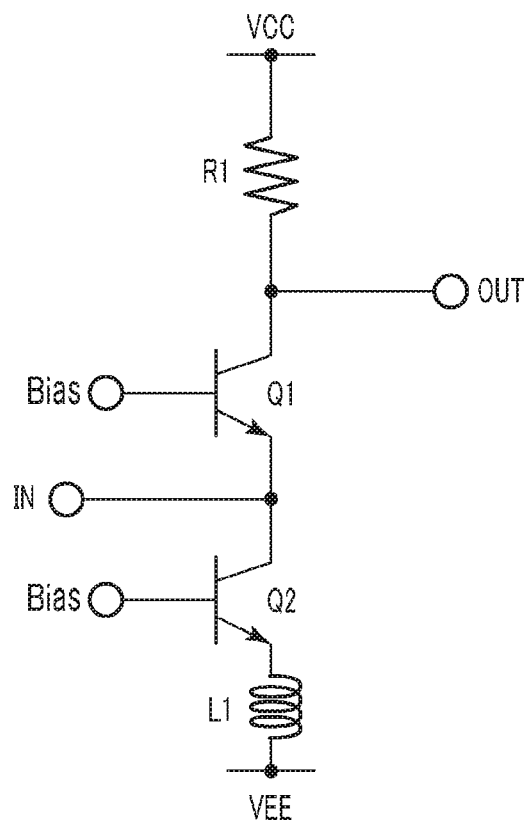
FIG. 6 illustrates the configuration of the grounded base-type TIA according to the first embodiment of the present invention.

FIG. 6 illustrates the configuration of the grounded base-type TIA according to the first embodiment of the present invention. The grounded base-type TIA includes the transistor Q2 and an inductor L1 serially inserted between the input terminal IN and the negative-side power source voltage VEE and an amplification stage consisting of the transistor Q1 and the resistance R1. The transistor Q2 has a base terminal that is connected to a current control bias to control the DC current flowing in the transistor Q1 and the DC component of the input signal current. The emitter terminal of the transistor Q2 is connected to the inductor element to thereby configure a current source having a high internal impedance, thus suppressing the deterioration of the noise characteristic of the TIA due to the current source.

Figure 7:
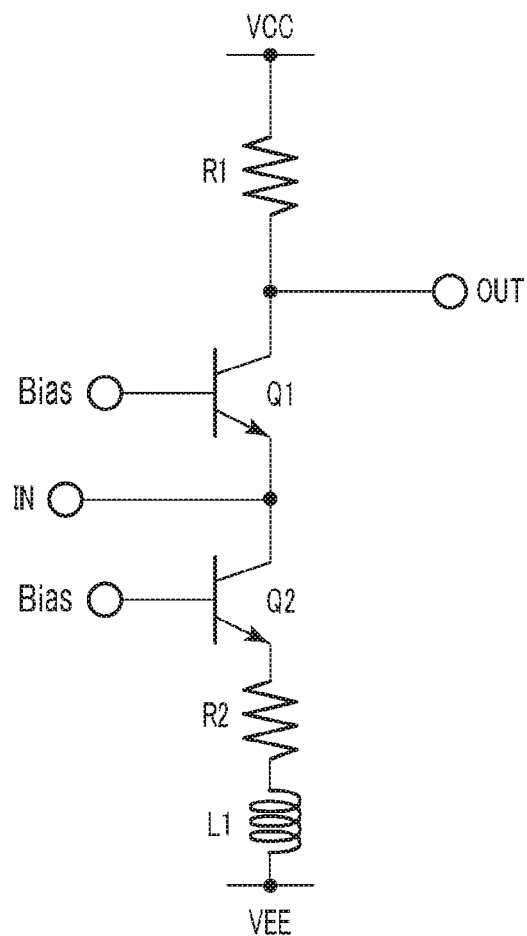
FIG. 7 illustrates the configuration of the grounded base-type TIA according to the second embodiment of the present invention.

FIG. 7 illustrates the configuration of the grounded base-type TIA according to the second embodiment of the present invention. Between an emitter terminal of the transistor Q2 functioning as a current source and the negative-side power source voltage VEE, resistance R2 is serially inserted in addition to the inductor L1. When compared with the first embodiment, a current source having a higher internal impedance can be realized.

A configuration using a bipolar transistor has been described that has the base terminal, the collector terminal, and the emitter terminal. However, a part or all of the transistors also can be substituted with an FET element having a gate terminal, a drain terminal, and a source terminal.

Figure 8:
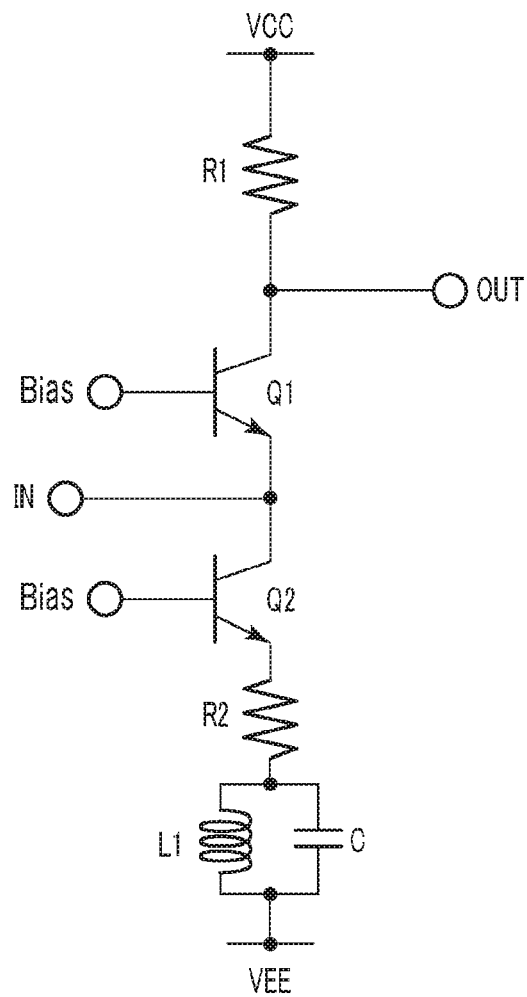
FIG. 8 illustrates the configuration of the grounded base-type TIA according to the third embodiment of the present invention.

FIG. 8 illustrates the configuration of the grounded base-type TIA according to the third embodiment of the present invention. A capacitive element C is connected in parallel to the inductor L1 at the grounded base-type TIA shown in FIG. 7. By the addition of the capacitive element C, the impedance Z seen from the emitter terminal of Q2 constituting the current source in the direction VEE can be calculated by the following formula.

$$Z = R2 + \frac{j\omega L}{1 - \omega^2 LC} \qquad \text{Formula 3}$$

$$\omega^2 LC = 1 \qquad \text{Formula 4}$$

At a frequency at which the Formula 4 is established, i.e., at a resonance point of the resonance circuit, $|Z|=\infty$ is established. When compared with the second embodiment, a current source can be realized that has a higher internal impedance.

In an actual case, a resistance component parasitic in the inductor L1 for example prevents the impedance seen from the emitter terminal in the direction VEE from increasing to ∞. However, the impedance can be made to be seemingly high in the vicinity of the resonance point. The third embodiment is effectively applied to a case where the amplifier cannot include therein an inductor having a sufficiently-high inductance. Furthermore, an LC resonance point designed in the frequency band of the TIA can provide a particularly-high internal impedance.

Figure 9A:
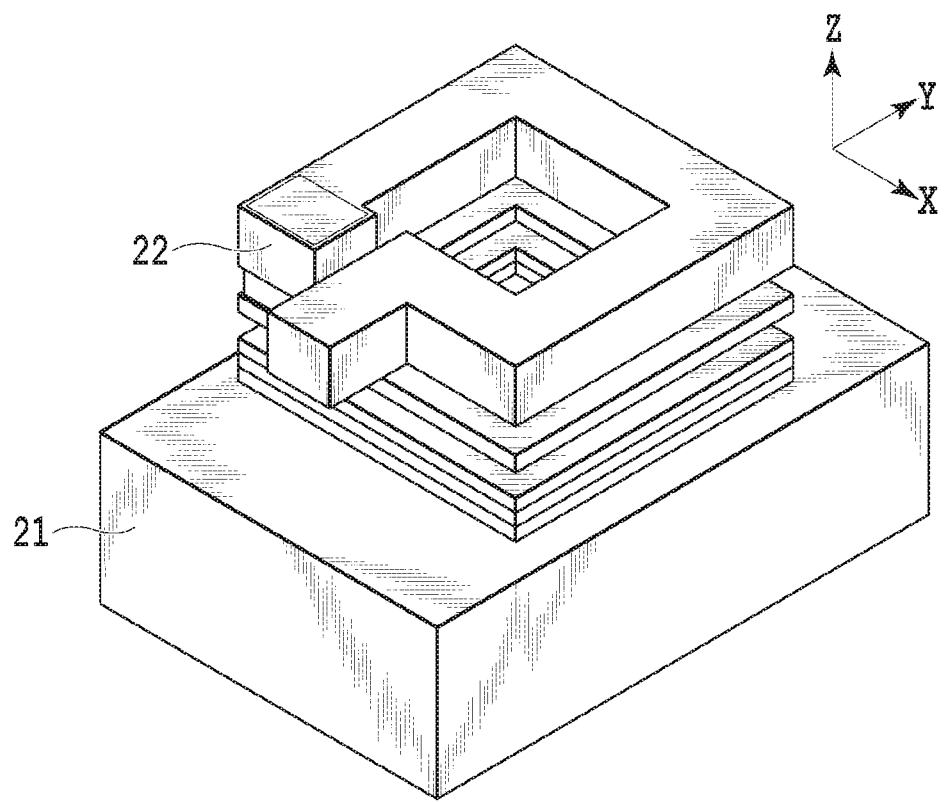
FIG. 9A illustrates a resonance circuit formed in the TIA chip.
Figure 9B:
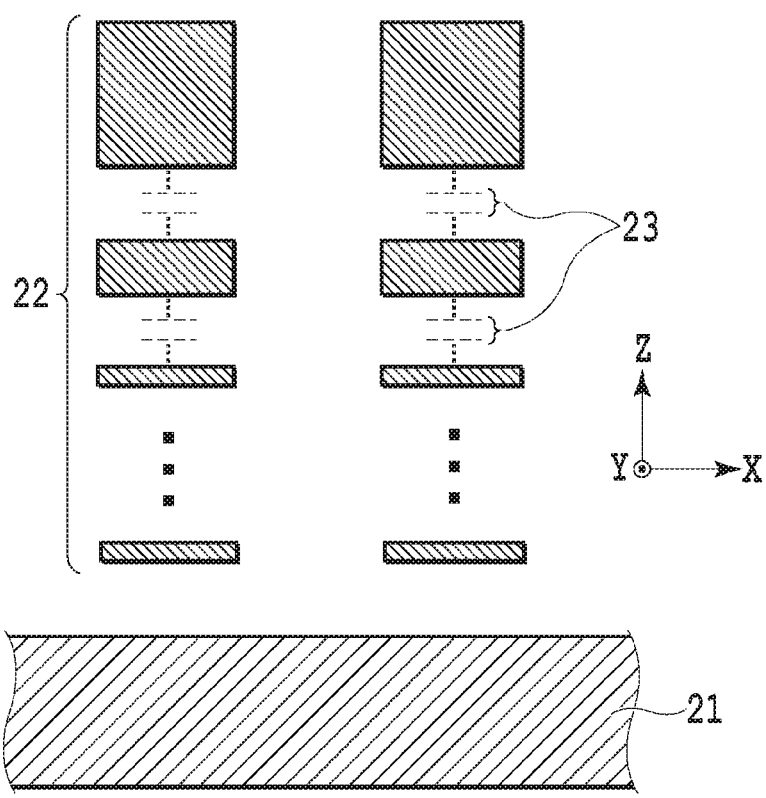
FIG. 9B illustrates the resonance circuit formed in the TIA chip.

FIGS. 9A and 9B illustrate a resonance circuit formed in the TIA chip. FIG. 9A is a bird's-eye view illustrating the inductor element having a three-dimensional structure formed in the TIA chip. A substrate 21 has thereon a plurality of wiring layers having partially-cut spiral wirings. The wirings among the respective wiring layers are cascade-connected so as to provide one continuous wiring, thereby forming an inductor element 22. The respective wiring layers are not shown.

When wirings are formed in adjacent wiring layers so as to be partially superposed one another, an LC parallel circuit using a parasitic capacitance 23 between wirings can be configured as shown in FIG. 9B. Thus, this configuration can have a high inductance value and also can function as an LC resonance circuit, thus providing a further-higher noise reduction effect.

Figure 2:
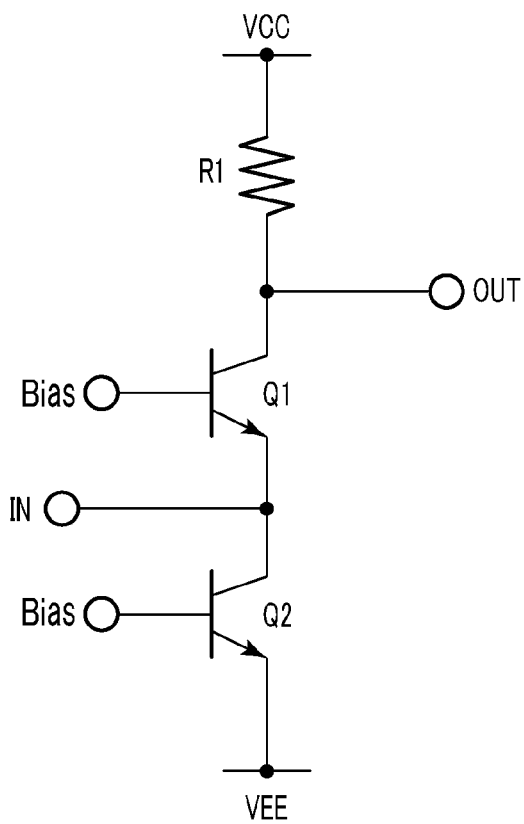
FIG. 2 illustrates the configuration of a conventional grounded base-type TIA.
Figure 3:
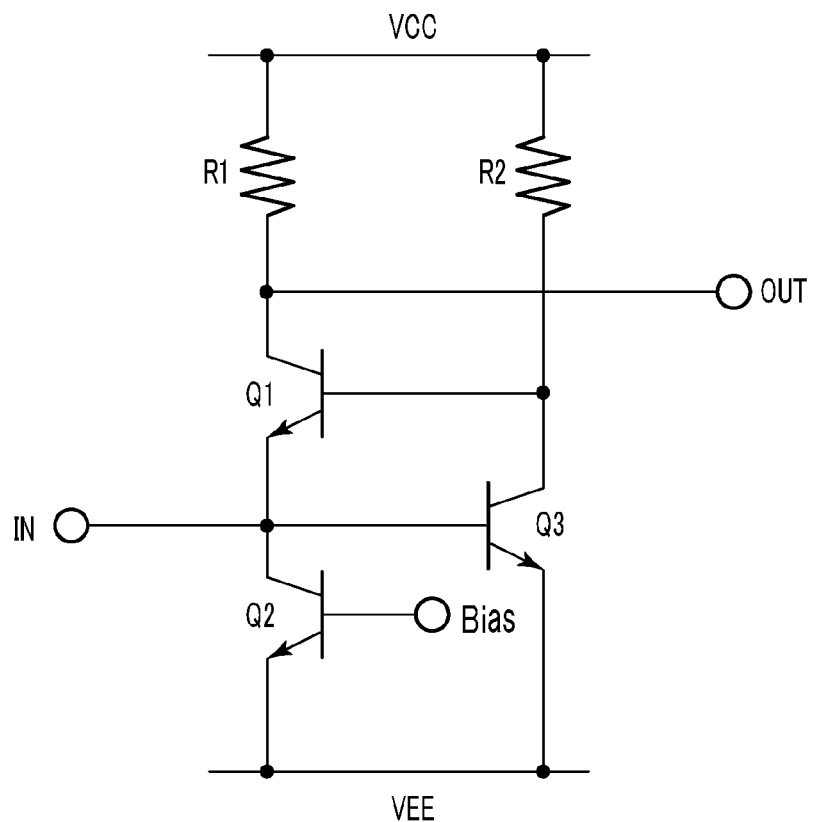
FIG. 3 illustrates the configuration of a conventional RGC-type TIA.
Figure 10:
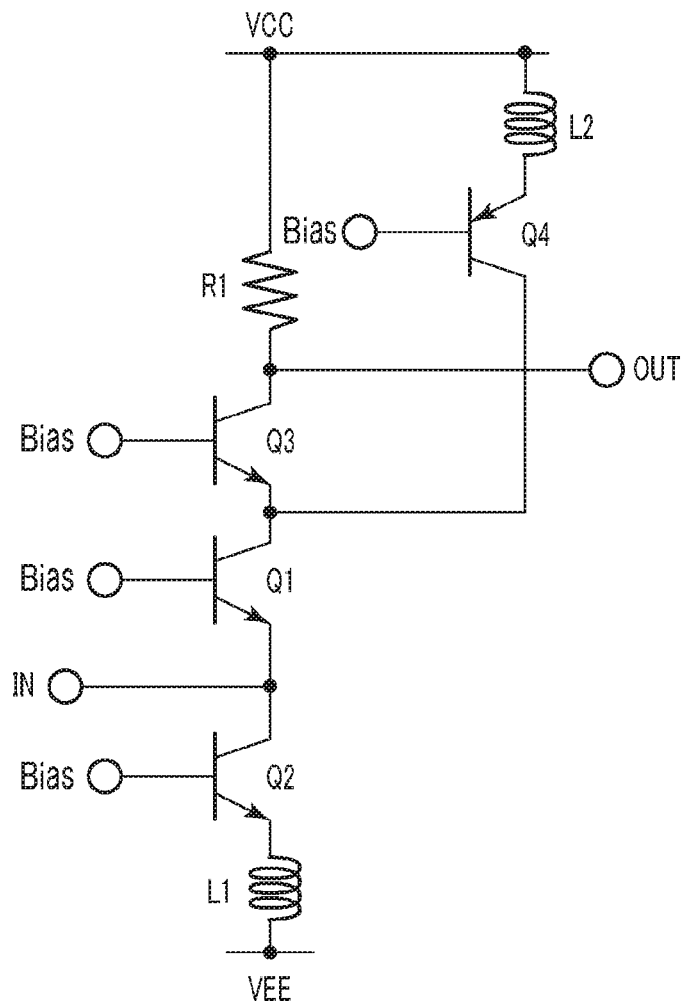
FIG. 10 illustrates the configuration of the grounded base-type TIA according to the fourth embodiment of the present invention.

FIG. 10 illustrates the grounded base-type TIA according to the fourth embodiment of the present invention. This configuration is obtained by adding the transistor Q3 in the grounded base-type TIA shown in FIG. 6 to provide a cascade-type structure, and includes the second current source consisting of the transistor Q4 and the inductor L2 between the positive-side power source voltage VCC and the collector terminal of the transistor Q1. By further providing the second current source consisting of the transistor Q4 and the inductor L2, the current flowing in the transistor Q1 of the amplification stage can be increased, achieving an operation in a wide band than in the case of the conventional TIA shown in FIG. 2. Furthermore, the cascade structure provided by the transistor Q3 can provide an effect to prevent the deterioration of the frequency band caused by the parasitic capacitance involved in the second current source.

Figure 11:
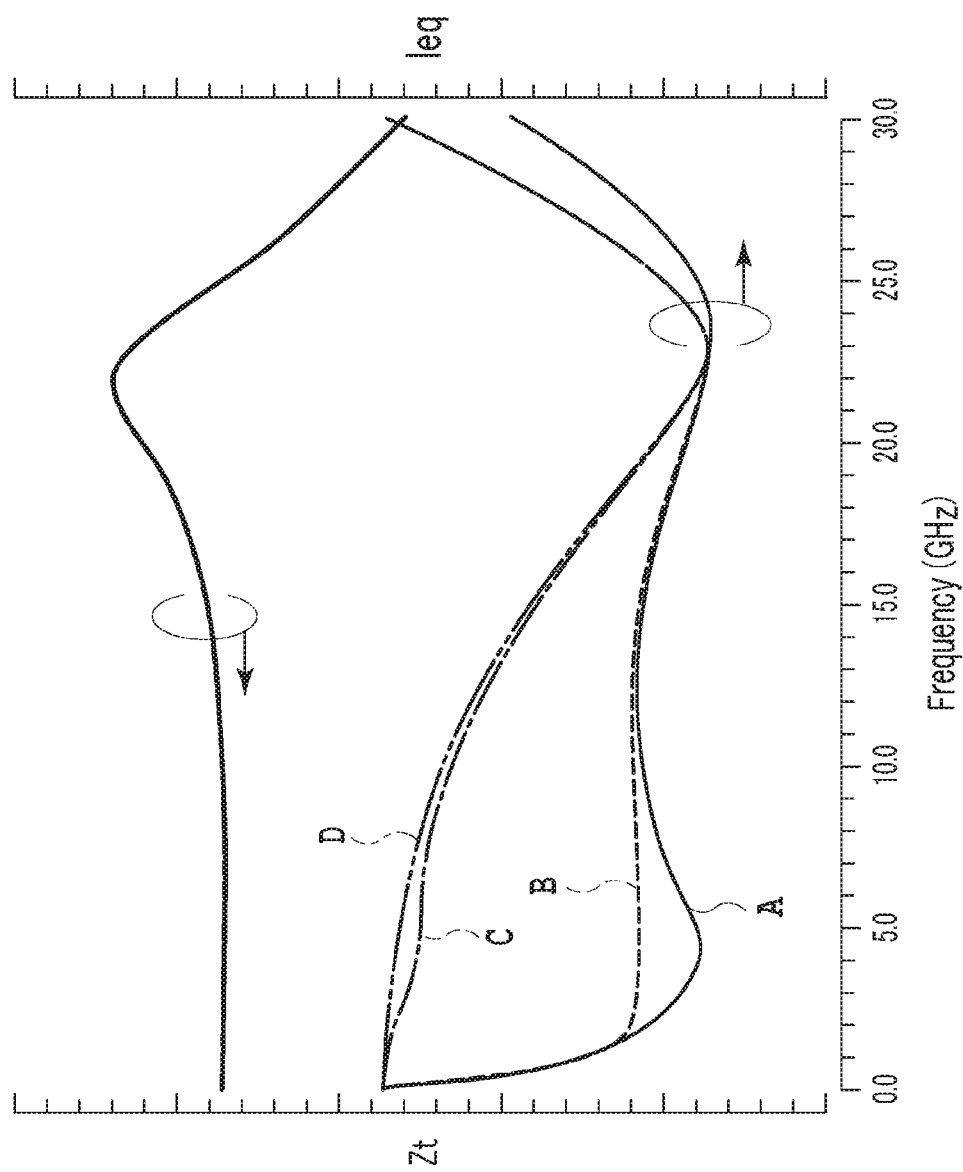
FIG. 11 illustrates the result of simulating the Zt and Ieq characteristics of the grounded base-type TIA.

FIG. 11 illustrates the result of simulating the transimpedance gain Zt and the input noise-converted current density Ieq characteristic of the grounded base-type TIA. The reference numeral A represents the grounded base-type TIA (having the inductors L1 and L2) of the fourth embodiment shown in FIG. 10. The reference numeral B represents the grounded base-type TIA (having only the inductor L1) of the first embodiment shown in FIG. 6. The reference numeral C represents the grounded base-type TIA as a modification of the fourth embodiment in which no inductor L1 is provided and only the inductor L2 is provided. The reference numeral D represents the conventional grounded base-type TIA shown in FIG. 2 (in which no inductor L1 or L2 is provided).

As can be seen from FIG. 11, the insertion of the inductors L1 and L2 can improve the input noise-converted current density Ieq without causing a change of the transimpedance gain Zt. The invention is not limited to the current source inserted between the input terminal IN and the negative-side power source voltage VEE and also can be applied to a current source configured by the transistor Q4 and the inductor L2 in the cascade-type TIA. Thus, this embodiment is not limited to the TIA including the current source that is inserted between the input terminal IN and the negative-side power source voltage VEE.

Figure 12:
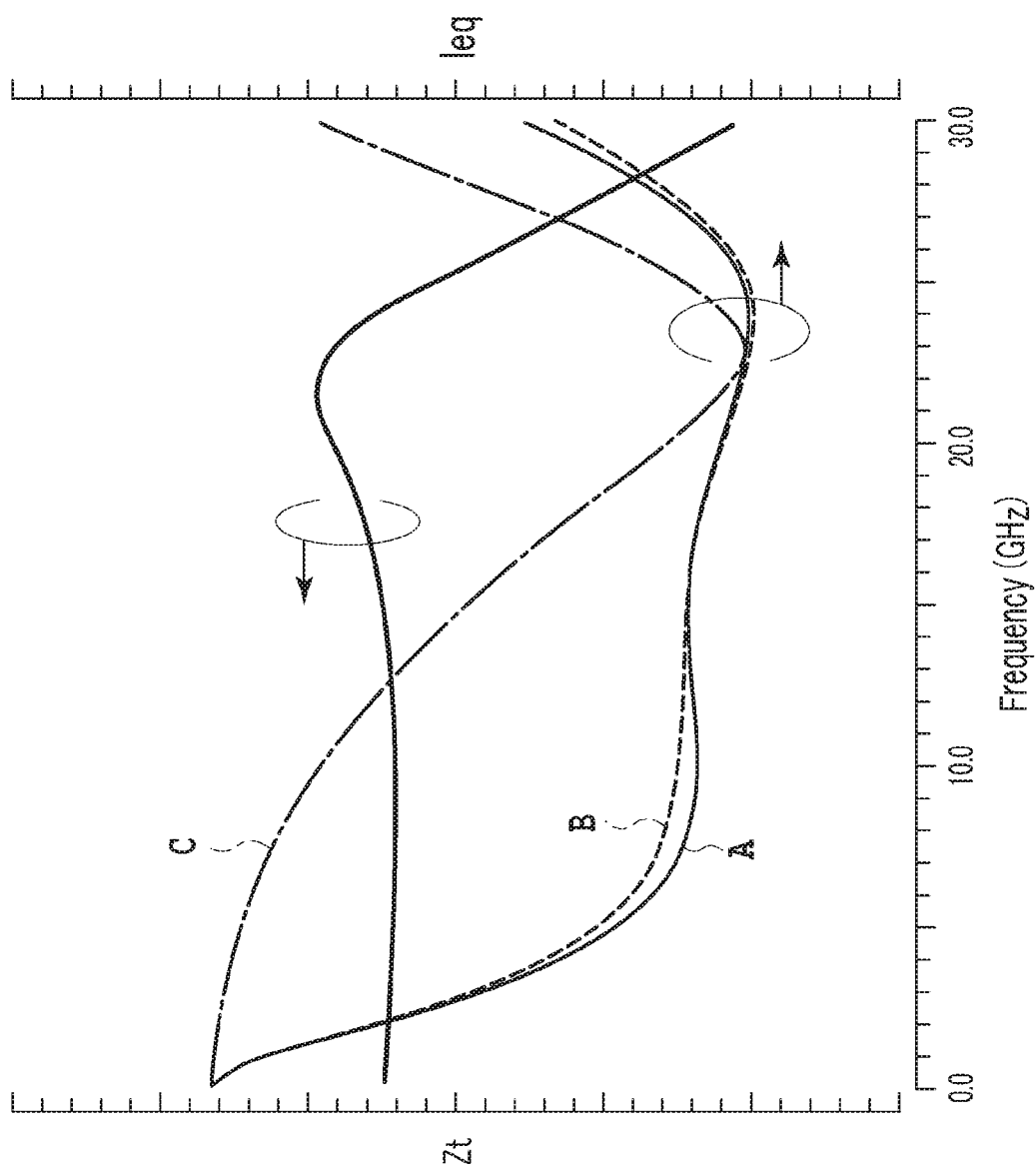
FIG. 12 illustrates the result of simulating the Zt and Ieq characteristics of the grounded base-type TIA.

FIG. 12 illustrates the simulation result. The reference numeral A illustrates the grounded base-type TIA (having the resistance R, the inductor L1, and the capacitive element C) of the third embodiment shown in FIG. 8. The reference numeral B represents the grounded base-type TIA (having only the resistance R and the inductor L1) of the second embodiment shown in FIG. 7. The reference numeral C represents the conventional grounded base-type TIA (in which no inductor L1 or L2 is provided) of FIG. 2.

As can be seen from FIG. 12, the insertion of the capacitive element C can improve, without causing a change of the transimpedance gain Zt, the input noise-converted current density Ieq, thus minimizing, in the frequency band of the TIA, the noise caused by the current source.

Grounded Emitter-Type TIA

Figure 13:
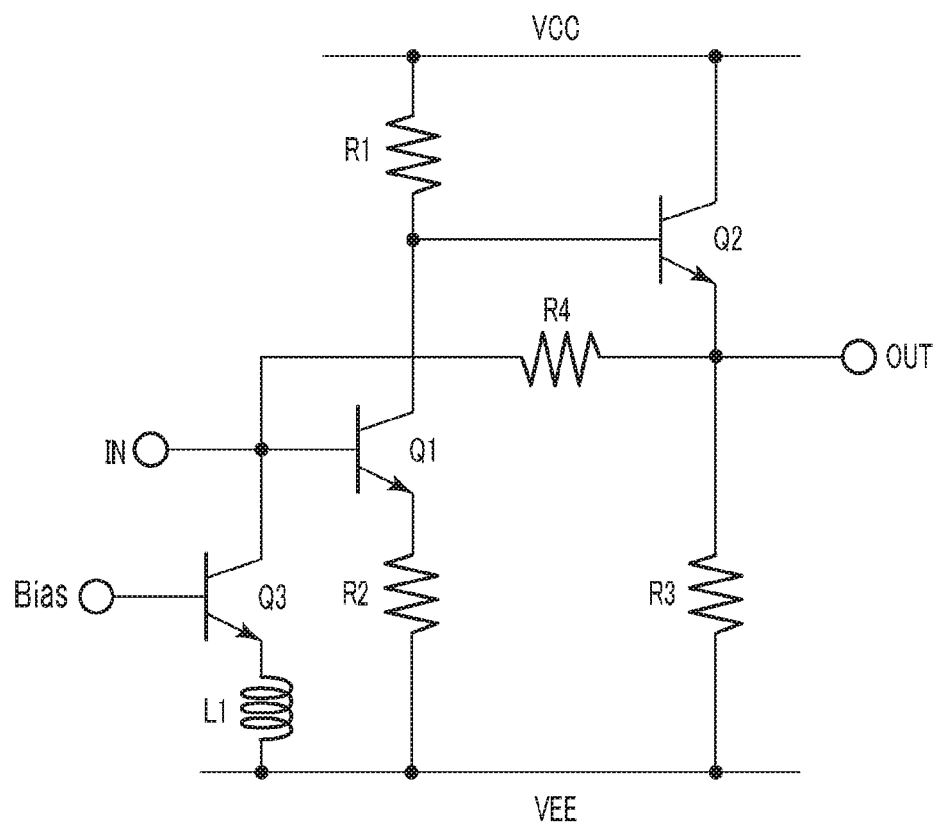
FIG. 13 illustrates the configuration of the grounded emitter-type TIA according to the fifth embodiment of the present invention.

FIG. 13 illustrates the configuration of the grounded emitter-type TIA according to the fifth embodiment of the present invention. The grounded emitter-type TIA includes: the transistor Q3 and the inductor L1 serially inserted between the input terminal IN and the negative-side power source voltage VEE; the amplification stage consisting of the transistor Q1 and the resistances R1 and R2; an output stage (emitter follower) consisting of the transistor Q2 and the resistance R3; and the feedback resister R4 inserted between the output terminal OUT and the input terminal IN. The transistor Q3 has a base terminal connected to the current control bias to control the DC current flowing in the transistor Q1 and the DC component of the input signal current. The emitter terminal of the transistor Q3 connected to the inductor element constitutes a current source having a high internal impedance to thereby suppress the deterioration of the noise characteristic of the TIA due to the current source.

The amplification stage has the transistor Q1 that has the base terminal connected to the input terminal IN, that has the emitter terminal connected to the negative-side power source voltage VEE via the resistance R2, and that has the collector terminal is connected to the base terminal of the transistor Q2 of the output stage. The output stage has the transistor Q2 that has the collector terminal connected to the positive-side power source voltage VCC and that has the emitter terminal connected to the negative-side power source voltage VEE via the resistance R3. The transistor Q1 has the collector terminal connected to the emitter follower of the output stage and thus can be considered as equivalent to the one being connected to the output terminal OUT.

Figure 1:
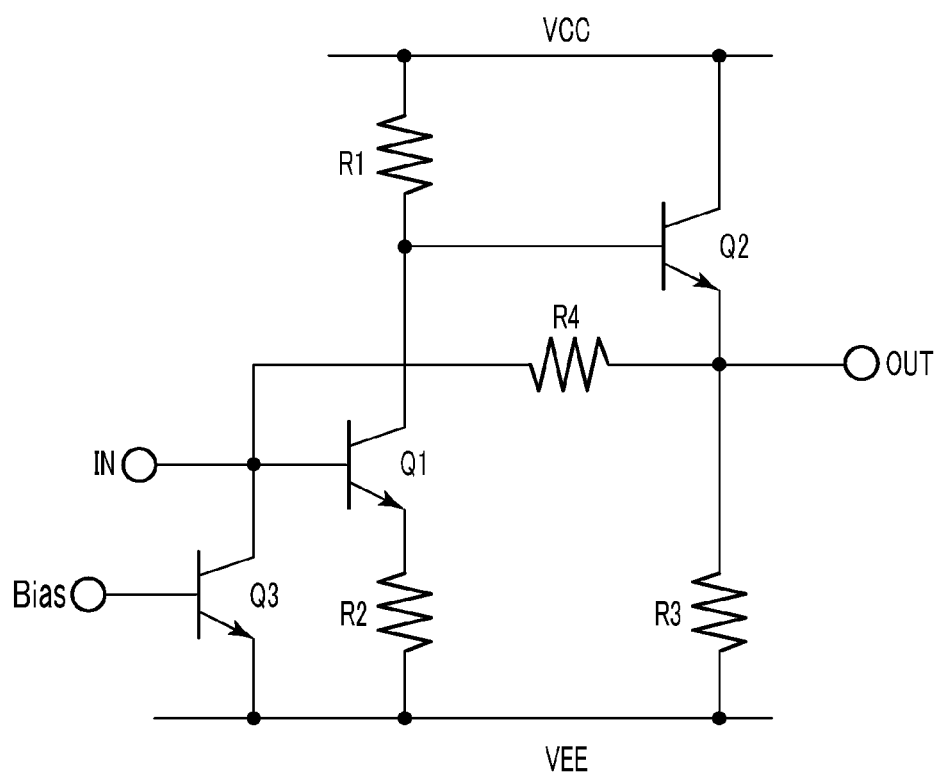
FIG. 1 illustrates the configuration of a conventional grounded emitter-type TIA.
Figure 14:
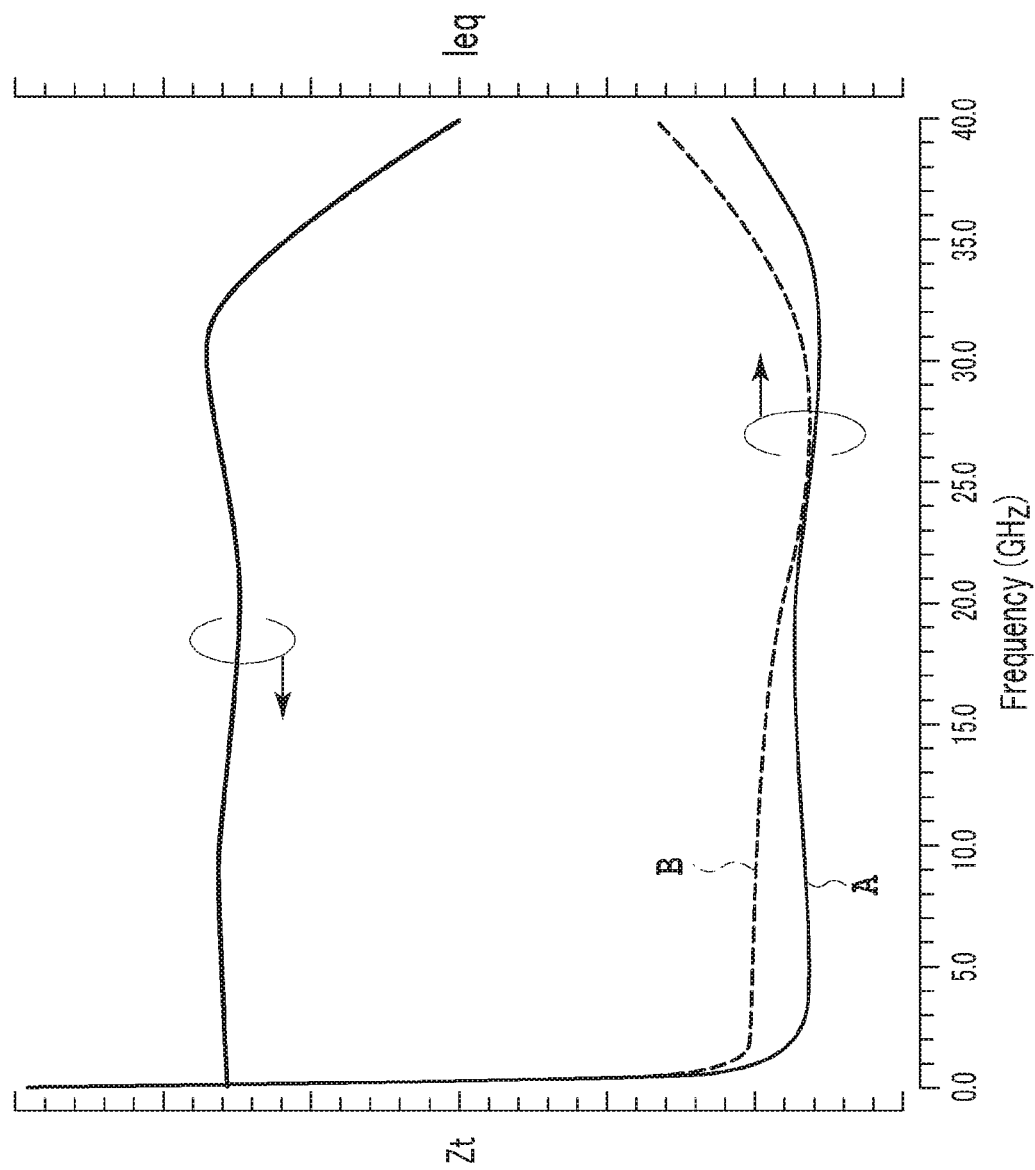
FIG. 14 illustrates the result of simulating the Zt and Ieq characteristics of the grounded emitter-type TIA.

FIG. 14 illustrates the result of simulating the transimpedance gain Zt and the input noise-converted current density Ieq characteristic of the grounded emitter-type TIA. The reference numeral A represents the grounded emitter-type TIA (having the inductor L1) of the fifth embodiment shown in FIG. 13. The reference numeral B represents the conventional grounded emitter-type TIA (having no inductor L1) shown in FIG. 1.

As is clear from FIG. 14, the insertion of the inductor L1 can improve the input noise-converted current density Ieq without causing a change of the transimpedance gain Zt. This embodiment also may be applied to the configuration as in the grounded base-type TIA in which resistance is inserted to have a serial connection to the inductor element. Instead of the bipolar transistor, a part or all of the transistors also may be substituted with FET elements. The TIA including a current source is not limited to the current source inserted between the input terminal IN and the negative-side power source voltage VEE.

RGC-Type TIA

Figure 15:
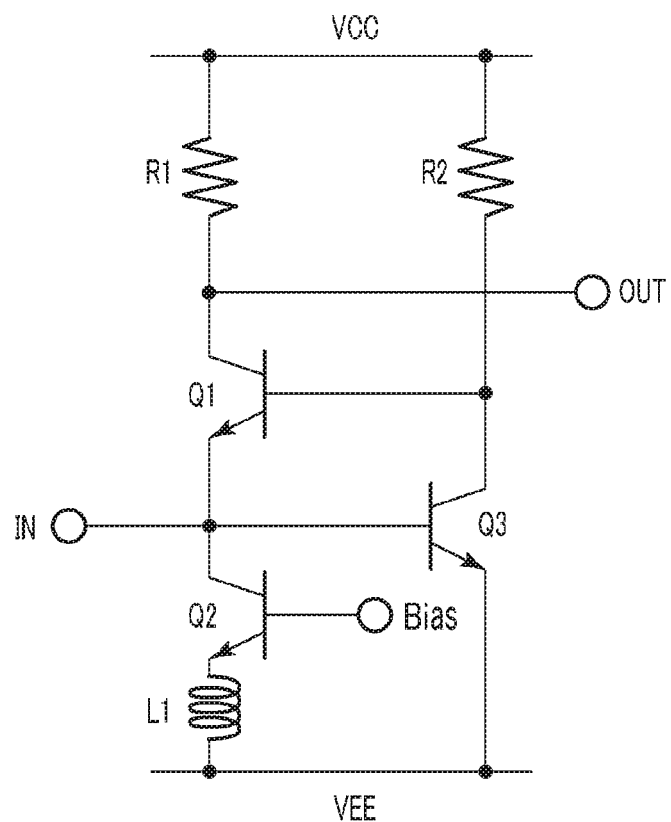
FIG. 15 illustrates the configuration of an RGC-type TIA according to the sixth embodiment of the present invention.

FIG. 15 illustrates the configuration of the RGC-type TIA according to the sixth embodiment of the present invention. The amplification stage consisting of the transistor Q1 and the resistance R1 is cascade-connected to the transistor Q2 and resistance R2. The transistor Q2 and the inductor L1 are inserted between the input terminal IN and the negative-side power source voltage VEE. The transistor Q2 has a base terminal connected to the current control bias to control the DC current flowing in the transistor Q1 and the DC component of the input signal current. The emitter terminal of the transistor Q2 connected to the inductor element constitutes a current source having an internal impedance, thereby suppressing the deterioration of the noise characteristic of the TIA due to the current source.

This embodiment also may be applied to a configuration as in the grounded base-type TIA in which resistance is inserted in a serial manner to the inductor element. Instead of the bipolar transistor, a part or all of the transistors also may be substituted with FET elements. The TIA including a current source is not limited to the current source inserted between the input terminal IN and the negative-side power source voltage VEE.

According to the first to sixth embodiments, an amplifier applied to the TIA in which a transistor function as a current source has an emitter terminal connected to an inductor element. This configuration realize a current source having a high internal impedance. This can consequently minimize the noise caused by the current source, thus realizing a low-noise TIA.

The invention claimed is:

1. An amplifier constituting a transimpedance amplifier, comprising:
   an amplification stage connected to an input terminal;
   a current source connected between the input terminal and a power source voltage line, the current source including a first transistor in which a base terminal is connected to a current control bias and a collector terminal is connected to the input terminal;
   an inductor element inserted between an emitter terminal of the first transistor and the power source voltage line.

2. The amplifier according to claim 1, wherein:
   the amplification stage has a second transistor in which an emitter terminal is connected to the input terminal, a collector terminal is connected to an output terminal, and a base terminal is connected to a current control bias.

3. The amplifier according to claim 2, wherein:
   the amplifier further comprises a second current source that includes a third transistor in which a base terminal is connected to a current control bias and a collector terminal is connected to the collector terminal of the second transistor; and
   a second inductor element is inserted between the emitter terminal of the third transistor and a second power source voltage line.

4. The amplifier according to claim 1, further comprising:
   a second transistor in which an emitter terminal is connected to the input terminal and a collector terminal is connected to an output terminal, and
   a third transistor in which an emitter terminal is connected to the power source voltage line, a collector terminal is connected to the base terminal of the second transistor, and a base terminal is connected to the input terminal.

5. The amplifier according to claim 1, wherein:
   the amplification stage includes a second transistor in which a base terminal is connected to the input terminal, a collector terminal is connected to an output terminal, and an emitter terminal is connected to the power source voltage line.

6. The amplifier according to claim 1, wherein:
   a resistance element is further inserted between the current source and the power source voltage line.

7. The amplifier according to claim 6, wherein:
   a capacitive element is further connected in parallel to the inductor element.

8. The amplifier according to claim 1, wherein:
   a transistor having a base terminal, a collector terminal, and an emitter terminal is partially or entirely configured by an FET having a gate terminal, a drain terminal, and a source terminal.

9. The amplifier according to claim 3, wherein:
   resistance elements are further inserted between the current source and the power source voltage line and between the second current source and the second power source voltage line.

10. The amplifier according to claim 9, wherein:
    a capacitive element is further connected in parallel to the inductor element and the second current source.

11. The amplifier according to claim 4, wherein:
    a resistance element is further inserted between the current source and the power source voltage line.

12. The amplifier according to claim 11, wherein:
    a capacitive element is further connected in parallel to the inductor element.

13. The amplifier according to claim 5, wherein:
    a resistance element is further inserted between the current source and the power source voltage line.

14. The amplifier according to claim 13, wherein:
    a capacitive element is further connected in parallel to the inductor element.

* * * * *